United States Patent [19]

Inada et al.

[11] Patent Number: 5,166,081

[45] Date of Patent: Nov. 24, 1992

[54] METHOD OF PRODUCING A BIPOLAR TRANSISTOR

[75] Inventors: Masanori Inada, Nara; Kazuo Eda, Osaka; Yorito Ota, Kobe; Atsushi Nakagawa, Kawanishi; Manabu Yanagihara, Osaka, all of Japan

[73] Assignee: Matsushita Electric Industrial Co., Ltd., Osaka, Japan

[21] Appl. No.: 549,589

[22] Filed: Jun. 27, 1990

Related U.S. Application Data

[60] Division of Ser. No. 420,656, Nov. 11, 1989, Pat. No. 4,965,650, which is a continuation of Ser. No. 30,607, Mar. 27, 1987, abandoned.

[30] Foreign Application Priority Data

| Apr. 1, 1986 | [JP] | Japan | 61-74738 |
| May 12, 1986 | [JP] | Japan | 61-107936 |
| Aug. 19, 1986 | [JP] | Japan | 61-193294 |
| Dec. 1, 1986 | [JP] | Japan | 61-286323 |

[51] Int. Cl.$^5$ .......................................... H01L 21/265
[52] U.S. Cl. .......................................... 437/31; 437/126; 437/133; 437/909; 148/DIG. 10; 148/DIG. 72
[58] Field of Search .................. 437/31, 126, 133, 909; 148/DIG. 10, DIG. 72, DIG. 102, DIG. 105, DIG. 100

[56] References Cited

U.S. PATENT DOCUMENTS

| 4,593,305 | 6/1986 | Kurata et al. | 437/126 |
| 4,593,457 | 6/1986 | Birrittella | 437/31 |
| 4,617,724 | 10/1986 | Yokoyama et al. | 437/126 |
| 4,679,305 | 7/1987 | Morizuka | 148/DIG. 10 |

Primary Examiner—Olik Chaudhuri
Assistant Examiner—Tuan Nguyen
Attorney, Agent, or Firm—Wenderoth, Lind & Ponack

[57] ABSTRACT

A dummy emitter is formed in the portion corresponding to an emitter region, on a multiplayer structural material comprising layers for forming emitter, base and collector, and using it as mask, an external base region is exposed by etching, and a projection of emitter region is formed, while the dummy emitter is inverted into an emitter electrode, thereby forming an emitter electrode metal layer to cover the whole upper surface of the emitter. Using thus formed emitter electrode metal layer, a base electrode metal layer is formed, by self-alignment, adjacently to the emitter. In other method, on a multilayer structural material, impurities are introduced outside the portion corresponding to the base region of a bipolar transistor in order to insulate, at least, the layer to form the emitter, the layer to form the base, or at most, these layers and the layer to form the collector, and an extension type dummy emitter extending from the emitter portion to the insulating region formed by transforming from the semiconductor material to form the emitter and using it as mask, the external base region is exposed to form a projection coupling the emitter region and insulating region, and the dummy emitter is inverted to transform into an emitter electrode metal layer to cover the whole upper surface of the projection.

8 Claims, 11 Drawing Sheets

METHOD OF PRODUCING A BIPOLAR TRANSISTOR

This application is a division of U.S. application Ser. No. 07/420,656, filed Nov. 11, 1989 now U.S. Pat. No. 4,965,650, which is in turn a continuation of now abandoned U.S. application Ser. No. 07/030,607, filed Mar. 27, 1987.

BACKGROUND OF THE INVENTION

1. Field of the Invention

This invention relates to a superhigh-speed, superhigh-frequency biopolar transistor device.

2. Description of the Prior Art

The current gain cut-off frequency $f_T$ and the power gain cut-off frequency $f_m$ of a bipolar transistor (BT) are expressed as follows.

$$f_T = \frac{1}{2\pi(\tau e + \tau b + \tau c + \tau cc)}$$

$$f_m = \sqrt{f_T} / \sqrt{8\pi R b C b c}$$

where $\tau e$ (emitter depletion layer charging time)=re (Cbc+Ceb), $\tau b$ (base transit time of minority carriers)=Wb²/2Db, $\tau c$ (collector depletion layer transit time of minority carriers)=Wc/2Vs, $\tau cc$ (collector depletion layer charging time)=(Ree+Rc) Cbc, Rb: base resistance, Cbc: base-collector capacitance, Ceb: base-emitter capacitance, Wb: base layer thickness, Db: base diffusion coefficient of minority carriers, Wc: collector depletion layer thickness, Vs: collector saturation velocity of minority carriers, re: emitter resistance, Ree: emitter-contact resistance, and Rc: collector resistance. <Large values of $f_T$ and $f_m$ are required for high speed operation of BT.>

In the BT, as is clear from the formulae above, to increase $f_T$ and $f_m$, it is necessary to decrease the capacitances of Cbc and Ceb, the thickness of base layer, the base resistance, the emitter resistance, and the collector resistance. In particular, to obtain a large $f_m$, it is necessary to reduce Rb and Cbc. For these purposes, it is extremely important to reduce the size of each part of BT, optimize the electrode layout, and optimize the process to lower the contact resistance of the electrodes, and various attempts have been made in these directions.

It has been reported by H. Kroemer that the heterojunction bipolar transistor (HBT) using a semiconductor material having a wider energy band gap than that of the base as the emitter is intrinsically superior to an ordinary BT (H. Kroemer, "Heterostructure Bipolar Transistors and Integrated Circuits", Proc. IEEE, vol. 70, P. 13, 1982). In the HBT, injection of holes from the base to the emitter is restricted (in the case of an NPN transistor), and hence it is possible to construct a base having a higher doping density and having an emitter and collector at a lower doping density than those of an ordinary BT. Therefore, it is intrinsically advantageous for the reduction of the base resistance Rb, the emitter-base junction capacitance Cjeb and the base-collector junction capacitance Cjbc. Since the emitter and collector are at low doping densities and the base is at a very high doping density, Cjeb and Cjbc are expressed as follows:

$$Cjeb \, \alpha \, \sqrt{ne} \, Ajeb, \quad Cjbc \, \alpha \, \sqrt{nc} \, Ajbc$$

where ne and nc are the doping density concentrations of the emitter and collector, and Ajeb and Ajbc are the junction areas of emitter and base, and base and collector, respectively. Therefore, Cjeb and Cjbc can be intrinsically reduced.

However, to utilize the above-described features effectively, the device structure and process should be optimized to reduce parasitic elements of resistance and capacitance. For this purpose, some methods have been attempted.

P. M. Asbeck et al. has reported a method to reduce the collector size by implanting oxygen ions into the collector layer. (P. M. Asbeck et al., "GaAs/(Ga, Al)As Heterojunction Bipolar Transistors with Buried Oxygen-Implanted Isolation Layer", Election Device Lett., vol. EDL-5, P. 310, 1984). However, the following problems occur in this method. A smaller mask than the buried collector is additionally required to make an emitter electrode. In this case, when the transistor size is made smaller, the mask alignment between the buried collector and the emitter electrode is more difficult. Furthermore, for a metal delineation from the emitter electrode, a different mask may be necessary. This may cause another problem in mask alignment between the emitter electrode and the metal delineation or contact lead when the transistor size is reduced, and may cause a step structure of the delineation metal at an end of the emitter electrode, and hence may cause the breakage of the delineation metal there.

Nagata et al. has reported a method to form the base electrode very close to the emitter portion by self-alignment and to reduce the external base resistance (Nagata et al., "A New Self-aligned Structure AlGaAs/GaAs HBT for High Speed Digital Circuits," Proc. Symp. on GaAs and Related Compounds (Inst. Phys. Conf. Ser. 790, P. 589, 1985). However, in this process and the structure by it, an emitter mesa and a base mesa are formed, and an emitter electrode is on the emitter mesa and a base electrode is formed very close to the emitter mesa separated by a SiO₂ side wall of the emitter mesa. This may necessitate other masks to form the metal delineation from the emitter electrode and the base electrode, and may form steps of the delineation metals at the ends of the emitter mesa and the base mesa, which may incur breakage of the delineation metal. In this process, the base electrode is formed before the emitter electrode is formed. Hence, there may be limitation in the types of the base electrode metals due to the difference in alloying temperature of the base and emitter electrode.

SUMMARY OF THE INVENTION

It is hence a primary object of this invention, relating to a bipolar transistor (BT) of a normal type having the emitter at the upper side thereof and of an inverted type having the collector at the upper side thereof, to present a first novel method of producing a BT by forming an emitter (a collector, in the case of the inverted type), an emitter (a collector, in the case of the inverted type) electrode, a low resistance external base by introduction of impurities, a buried type collector (an emitter, in the case of the inverted type) by introduction of impurities, and a base electrode positioned at an extremely close distance to the emitter, by self-alignment, using a single mask for forming the emitter (the collector, in the case of the inverted type).

It is another object of this invention to present a second novel method of producing a BT by forming an emitter (a collector, in the inverted type), an emitter (a collector, in the inverted type) electrode, a metal delineation from an emitter (a collector, in the inverted type) electrode, a low resistance external base by introduction of impurities, a buried type collector (an emitter, in the inverted type) by introduction of impurities, a base electrode positioned at an extremely close distance to the emitter, and a metal delineation from a base electrode, by self-alignment, using a single mask for forming the emitter (the collector, in an inverted type).

It is a further object of this invention to present a first novel BT structure comprising an emitter extending an emitter (a collector, in the inverted type) region to an insulating region formed by converting from semiconductor material forming the base and an emitter (a collector, in the inverted type) electrode metal layer covering the entire surface thereof.

It is a still further object of this invention to present a second novel BT structure possessing a base electrode metal layer positioned in an external base region excluding the base region substantially the emitter (a collector, in the inverted type) electrode in the first BT structure, and extending from the external base region to the insulating region around the base.

It is yet another object of this invention to present a novel BT structure possessing, in addition to the first structure, second structure, or the combination of first and second structure, an external base region having a higher dopant concentration or a greater thickness than the base region just beneath the emitter (a collector, in the inverted type) electrode, or a buried type collector (an emitter, in the inverted type) region substantially the same size as the emitter electrode, or both of them.

To achieve the above objects, the following method is applied to form the BT of this invention.

In a first method, on a multilayer structural material containing layers for forming emitter, base and collector, a dummy emitter (a dummy collector, in the inverted type) is formed in the portion corresponding to an emitter (a collector, in the inverted type), an external base is exposed and an emitter mesa is formed by etching, using this dummy emitter (collector, in the inverted type) as a mask, the surface is coated and flattened with a photosensitive resist, and the top part of the dummy emitter (the collector, in the inverted type) is exposed by dry etching and the dummy emitter is removed by etching, and an emitter (a collector, in the inverted type) electrode metal layer which covers the entire top surface of the emitter mesa is formed in the formed opening.

In a second method, base electrode metal is evaporated using the umbrella-shaped emitter (the collector, in the inverted type) electrode layer projected around the emitted (the collector, in the inverted type) mesa as a mask, which is formed by said first method, and consequently the base electrode layer is formed very close to the emitter (the collector, in the inverted type) mesa.

In a third method, side walls made of an insulating thin film are disposed on the side of the emitter (a collector in the inverted type) mesa and the emitter (the collector, in the inverted type) electrode layer, which are formed by said first method, a base electrode metal is evaporated, the surface is coated and flattened with a photosensitive resist, and the upper surface of the emitter (the collector, in the inverted type) mesa is exposed by dry etching, and the base electrode metal depositing on the side wall of the emitter (the collector, in the inverted type) mesa is removed by etching, thereby separating the emitter and base electrodes.

In a fourth method, in an intermediate process of the first method, a buried type collector of substantially the same size as the dummy emitter (the dummy collector, in the inverted type) is formed, ions are implanted into the collector (the emitter, in the inverted type) layer using the dummy emitter (the dummy collector, in the inverted type) as a mask and insulating the ion-implanted region by it.

In a fifth method, in an intermediate process of the first method, a dopant different in concentration or kind from the dopant in the base region is introduced into the external base region outside of the base region just beneath the dummy emitter (the collector, in the inverted type), using the dummy emitter (the collector, in the inverted type) as a mask, and consequently an external base of higher concentration or greater thickness is formed.

A sixth method comprises a step of forming a base isolation region by implanting ions into at least the layer forming the base on the outside of the base region, from above onto a multilayer structural material, a step of forming an extension type dummy emitter (a dummy collector, in the inverted type) having a structure extended from the emitter (the collector, in the inverted type) region to the formed base isolation region, a step of forming an extension type emitter (the collector, in the inverted type) region to the formed base isolation region, by exposing the external base region by etching, using the extension type dummy emitter (the dummy collector, in the inverted type) as a mask, and a step of inverting the extension type dummy emitter (the dummy collector, in the inverted type) into an emitter (a collector, in the inverted type) electrode metal layer.

In seventh and eighth methods, using the extension type emitter (the collector, in the inverted type) mesa formed by the sixth method and the emitter (the collector, in the inverted type) electrode metal layer to cover its whole upper surface, a base electrode metal layer positioned very close to the emitter (the collector, in the inverted type) mesa and extending from the external base region to the base isolation region is formed by applying the second and third methods.

BRIEF DESCRIPTION OF THE DRAWINGS

FIGS. 1(a)-1(c) show an example of the structure of a bipolar transistor of this invention, in which

FIGS. 6(a)-(g), 7(a)-(b), 8(a)-(b), 9(a)-(e), and 10 are sectional views indicating the method of forming the emitter electrode metal layer by inverting from the dummy emitter, in which FIGS. 6(a)-(g) relate to a case of covering the entire upper surface of emitter, with the emitter electrode metal layer substantially same in size as the emitter.

FIGS. 11 and 12 are sectional views showing the method of forming a low resistance external base region in self-alignment with the emitter by ion implantation as a mask in which

FIGS. 15(a)-(b), 16(a)-(c), 17(a)-(d), 18(a)-(b), 19(a)-(b), and 20(a)-(c) represent methods of forming a base electrode metal layer adjacent to the emitter portion in self-alignment with the emitter by using the emitter electrode metal layer or the dummy emitter as a mask in which

FIGS. 21(a)-1 to (b)-3 show a self-alignment forming method of forming an emitter mesa extended from an emitter region to the base insulation region, and an emitter electrode metal layer to cover the entire surface of the top of this mesa.

In the drawing figures, the reference numbers are meant as follows:

1—semi-insulating GaAs substrate, 2—high doping density n-type GaAs, 2a—part of 2 to compose a bipolar transistor, 3—N-type GaAs, 3a—collection region, 3b—insulation region formed by transforming from material of 3, 4—high doping density p-type GaAs, 4a—part of 4 to compose a bipolar transistor, 4b—base region just beneath emitter electrode metal layer or the layer composed of it and side wall, 4c—base region of outside of 4b, 4d—thick outer base region, 5—n-type $Al_xGA_{l-x}As$, 5a—part of 5 to compose a bipolar transistor, 5b—insulating region formed by transforming from the material of 5, 5c—p-type region formed by transforming from the material of 5, 6—high doping density n-type GaAs, 6a—part of 6 to compose a bipolar transistor, 6b—insulating region formed by transforming from the material of 6, 7—multilayer structural material composed of parts 1 to 7, 8—emitter region composed of 5a and 6a, 9—mesa composed of 8 and 5b, 6b, 10a—emitter electrode metal layer covering the whole upper surface of mesa 9 in a form of umbrella, 10b—wiring pattern of emitter electrode, 10c—emitter electrode metal layer covering the whole upper surface of mesa 9, having substantially same size as mesa 9, 10d—mushroom-shaped emitter electrode metal layer to cover the upper surface of mesa 9, 10e—emitter electrode metal layer covering the whole upper surface of emitter, having substantially same size as emitter, 10f—emitter electrode metal layer to cover the whole upper surface of emitter in a form of umbrella, 10g—mushroom-shaped emitter electrode metal layer to cover the whole upper surface of emitter, 11a—base electrode metal layer extending from outer base region to peripheral insulating region, 11b—base electrode wiring pattern, 11c—base electrode formed adjacently to emitter portion, 12a—collector electrode, 12b—collector electrode wiring pattern, 13—insulating region inside transistor, 14—external insulating region isolating transistors from each other, 15—undercut portion by wet etching, 16—multilayer structural material composed of 7, 35 and 36, 17—side wall, 18—$SiO_x$ dummy emitter, 19—Al dummy emitter, 20—dummy emitter, 21—photosensitive resist, 22a—opening with exposed 6a, 22b—umbrella-shaped opening with exposed 6b, 23—$Al_xGa_{l-x}As$ ($x \geq 0.4$) to protect layer 6, 24—ion implantation (Be+), 25—ion implantation (O+), 26—ion implantation (H+), 27—mask of photosensitive resist, 28—base electrode metal, 29a—base region, 29b—mask in same size as base region, 30—$SiO_x$ dummy emitter extending from emitter region to insulating region, 31—Al dummy emitter to cover the whole upper surface of 30, 32—dummy emitter composed of 30 and 31, 33—cross section of bipolar transistor, 34—cross-section of bipolar transistor, 35—n-type $In_xGa_{l-x}As$ (x=0 to 1), 35a—part of 35 formed on emitter portion 8, 36—n-type InAs layer, and 36—part of 36 formed on emitter 8.

DESCRIPTION OF THE PREFERRED EMBODIMENTS

Figure 1A:
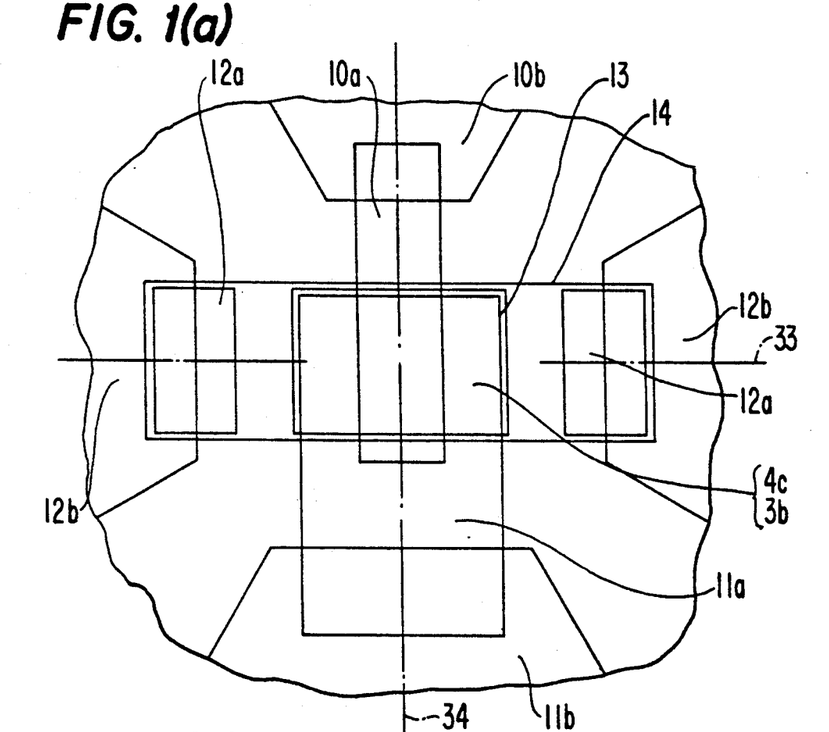
FIG. 1(a) is a layout plan of parts.
Figure 1B:
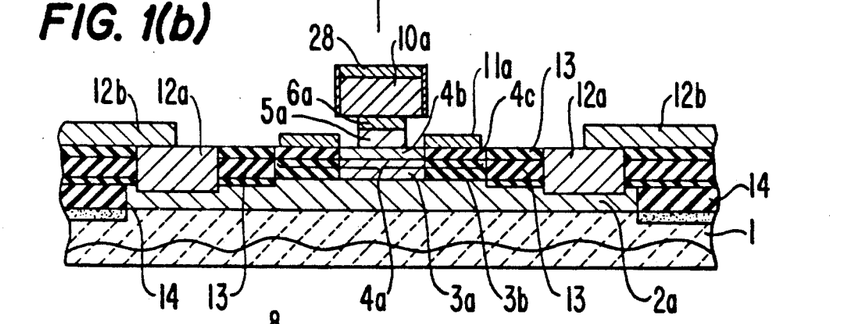
FIG. 1(b) is a front section view.
Figure 1C:
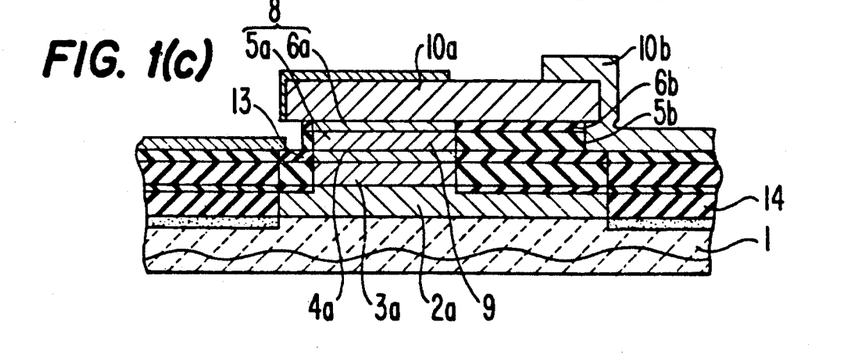
FIG. 1(c) is a side sectional view.

1. FIGS. 1(a)-(c) show an npn type heterojunction bipolar transistor (HBT), as an example of structure of bipolar transistor (BT) of this invention. FIG. 1(a) is a conceptual drawing showing a plan view of the configuration of each part of HBT, and FIG. 1(b) is a sectional view cutting FIG. 1(a) on a plane 33 perpendicular to the paper surface, while FIG. 1(c) is a sectional view cutting FIG. 1(a) on a plane 34 perpendicular to the paper surface.

On the circumference of base region 4a composed of high doping density p-type GaAs (p+-GaAs), there are insulating region 13 formed by transforming from the p+-GaAs and n-type GaAs (n-GaAs) to form collector region 3a, and insulating region 14 formed by transforming from high doping density n-type GaAs (n+-GaAs) layer to form the contact for collector 2a.

The emitter region 8 is composed of part 5a made of n-type $Al_xGa_{1-x}As$ (n-AlGaAs) with a large energy band gap, and part 6a made of N+-GaAs, and forms the mesa 9 coupled with an insulating region composed of 6b and 5b formed by transforming from the semiconductor materials of 6a and 5a.

The emitter electrode metal layer 10a covers the whole upper surface of said mesa 9, and has a structure of projecting like an umbrella around the mesa 9, and this structure serves both as emitter electrode and as emitter electrode delineation metal.

Accordingly, the resistance of the emitter contact is extremely small as compared with that of the conventional HBT. Besides, the wiring pattern 10b can be formed very easily by using a simply mask, and this wiring pattern 10b is also free from wire disconnections due to step breakage, which is a conventional problem, because it contacts with the emitter electrode metal layer 10a on three sides. Moreover, since the emitter electrode metal layer 10a serves both as emitter electrode and as emitter electrode delineation metal, an HBT of an extremely small emitter size may be easily fabricated. Part 6b of mesa 9 is insulated in this embodiment, but it is not necessarily insulated. If the part 6b is left in a state of n+-GaAs, the capacitance in the insulating region 14 enclosed between electrode metal layer 10a and N+-GaAs layer 2 is slightly increased, but this change is negligibly small in an HBT of small size. To the contrary, since the area used to form the emitter contact is widened, it is effective to reduce the contact resistance. Similarly, the upper portion of part 5b may be also in an n-type state.

The base electrode metal layer 11a exists in the external base region 4c outside of the base region 4b just beneath the umbrella-shaped emitter electrode metal layer 10a, and extends from the external base region 4c to peripheral insulating region 14, working both as base electrode and as base electrode delineation metal. Accordingly, the formation of base wiring pattern is extremely easy. Since this electrode layer exists in the same plane, step breakage does not occur. Incidentally, since the electrode layer 11a is formed very close to the emitter part 5a, the external base resistance is greatly reduced.

Just beneath the emitter electrode metal layer 10a, a buried type collector 3a substantially of the same size as the emitter electrode portion is formed, together with an insulating region 3b formed by transforming from the same semiconductor material as 3a, on its periphery. Hence the base-collector junction capacitance Cjbc can be greatly decreased.

The base region 4c outside of the base region 4b just beneath the emitter electrode is of p-type with a higher doping density than the base region 4b. Accordingly, the external base region possesses a small sheet resistance.

In this embodiment, the HBT comprehensively possessing the features of the parts mentioned above is formed.

In said structure of the HBT, $Al_xGa_{1-x}As$ is used as emitter, and GaAs is used to form other parts, but the same structure may be also applicable to an HBT made of other materials, or to be usual homojunction BT composed of an emitter, base and collector of the same semiconductor material, or a pnp type BT. Moreover, it may also be applied to an inverted type HBT or BT in which the positions of emitter and collector are exchanged so that the collector is on the upper side.

Figure 2:
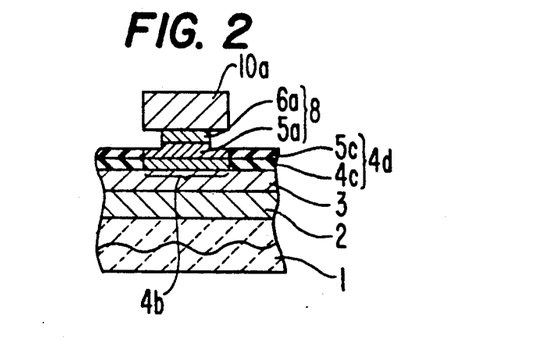
FIG. 2 is a sectional view showing the relationship of the emitter electrode metal layer and a thick external base region formed by self-alignment of a bipolar transistor of this invention.

2. FIG. 2 shows a different structure of embodiment 1, wherein the base region 4d outside of the base region 4b just beneath the emitter electrode metal layer 10a is a thick external base region composed of a p-type region 5c formed by transforming from the emitter region 5c and external base region 4c of p+-GaAs.

As a result, the sheet resistance of the external base may be reduced. It does not matter at all if the external base region extends to the portion of collector layer 3, and it is contrarily effective to lower the sheet resistance of the external base.

Figure 3:
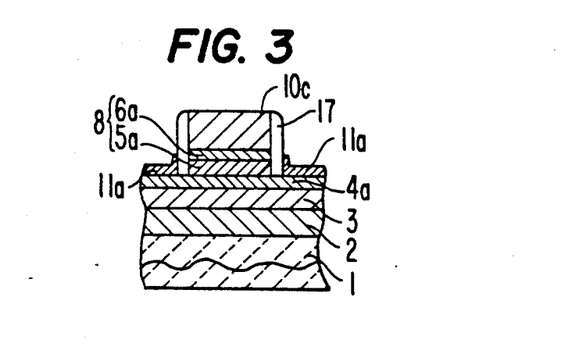
FIGS. 3, 4, 5 are sectional views showing the configuration of the emitter electrode metal layer, the emitter portion and the base electrode metal layer of a bipolar transistor of this invention.

3. FIG. 3 shows another structure of the emitter electrode metal layer 10a and base electrode metal layer 11a in embodiment 1.

In FIG. 3, relating to embodiment 1, the whole upper surface of the emitter mesa 9 is covered by the emitter electrode metal layer 10c of substantially the same size therewith, a side wall 17 made of $SiO_x$ thin film of 3000 Å in thickness is formed on the sides around the mesa 9 and emitter electrode metal 10c, and a base electrode metal layer 11a is formed substantially in contact with the side wall 17, extending from the external base to the peripheral insulating region. The effect is same as mentioned in embodiment 1. As the side wall, meanwhile, other insulating material such as $SiN_x$ may be used.

Figure 4:
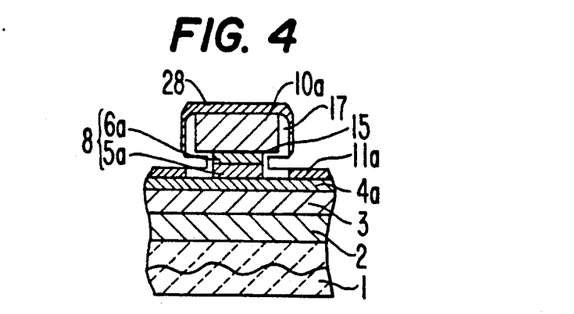

4. FIG. 4 shows a further different composition of embodiment 1, in which a side wall 17 made of thin film of $SiO_x$ in 3000 Å in thickness is formed on the side of emitter mesa 9 and emitter electrode metal layer 10a, and a base electrode metal layer 11a is formed substantially in contact with the side wall 17, extending from the external base to the peripheral insulating region 14. As the side wall, other insulating materials such as $SiN_x$ may be also used.

Figure 5:
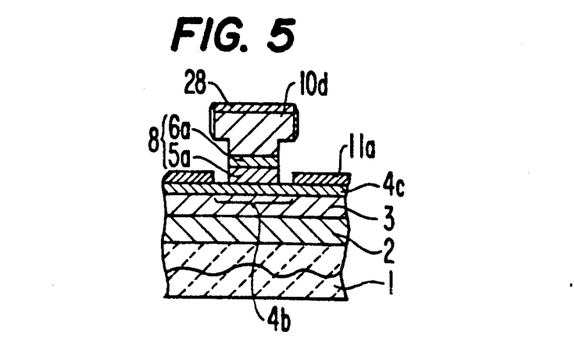

5. FIG. 5, also relating to embodiment 1, shows a structure in which the whole upper surface of mesa 9 is covered with emitter electrode metal layer having a mushroom-shape spreading to the peripheral parts of the mesa 9, and outside of the base region 4b just beneath the mushroom electrode 10d, there is a base electrode metal layer 11a extending from the external base region 4c to the peripheral insulating region 14.

Figure 6A:
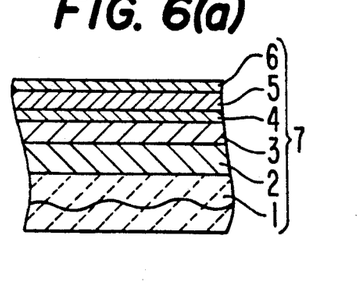
Figure 6B:
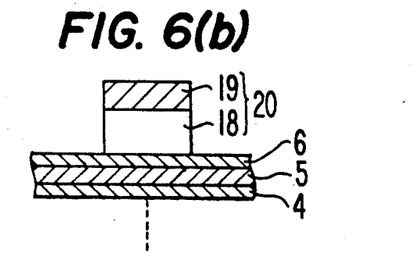

6. FIGS. 6(a)-(g) illustrate a method of fabrication used to form an emitter electrode metal layer 10e which covers the whole upper surface mesa of mesa 9. As shown in FIG. 6(a), on a semi-insulating GaAs substrate 1, a multilayer structural material 7 composed of n+-GaAs layer 2, n-GaAs layer 3, p+-GaAs layer 4, n-AlGaAs layer 5, and n+-GaAs layer 6 is formed by epitaxial growth.

On this multilayer structural material 7, a 1 μm thick $SiO_x$ thin film is formed, and in the portion corresponding to emitter on this film, an Al layer 19 of 5000 Å in thickness is formed by evaporating and lifting off, and $SiO_x$ layer 18 corresponding to emitter portion is formed by dry etching with $CHF_3$, using the Al layer 19 as a mask (FIG. 6 (b)). By exposing the external base region 4c by etching, using a dummy emitter 20 composed of $SiO_x$ layer 18 and Al layer 19 as a mask, and a protruding emitting region 8 is formed (FIG. 6(c)). In succession, the surface is covered and flattened with photosensitive resist 21 (FIG. 6(d)), and the photosensitive resist 21 is etched by dry etching using oxygen plasma, and the upper part of dummy emitter 20 is exposed (FIG. 6(e)), then, removing the Al layer 19 by hydrochloric acid and also removing $SiO_x$ 18 by buffer HF, an opening 22a is formed (FIG. 6(f)). Next, in this opening 22a, AuGe, Ni, Ti and Au are evaporated in this order and lifted off, and an emitter electrode metal layer 10e is formed (FIG. 6(g)). As a result, the emitter electrode metal layer 10e used to cover the whole upper surface of emitter mesa 8 is formed. In this embodiment, meanwhile, as the layer used to form dummy emitter, an $SiO_x$ layer and an Al layer are used, but instead of $SiO_x$, other materials such as $SiN_x$ may also be used. Or, instead of Al, other metals may be used, too. Incidentally, after forming the $SiO_x$ layer 18 by dry etching, the Al layer 19 is not necessarily required. In this embodiment, the external base region 4c can be made also by etching until close to the external base region using a dummy emitter 20 as a mask, and then by etching up to the external base region using the emitter electrode metal layer as a mask. This has an effect to protect the external base region from being damaged during the process. This process can be applied also to a homojunction BT, or a HBT or BT of the inverted type.

Figure 7A:
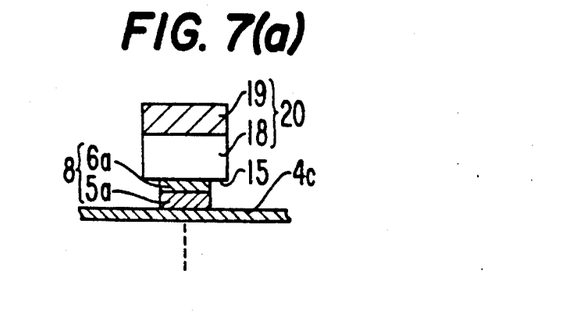
FIGS. 7(a)-(b) show the emitter electrode metal layer covering the upper surface of the emitter in a form of an umbrella, FIGS. 8(a)-(b) refer to a case of placing a semiconductor material layer greater in the work function than the electrode metal, between the emitter electrode metal layer and emitter shown in FIGS. 6(a)-(g), FIGS. 9(a)-(b) denote a case of placing the emitter electrode metal layer on the emitter to cover its upper surface in a mushroom shape.
Figure 7B:
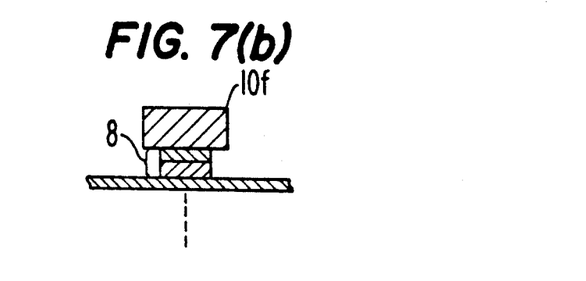

7. FIGS. 7(a)-(b), relating to embodiment 6, show a different structure, in which, after forming the dummy emitter 20 as in FIG. 6(b), wet etching is carried out to expose the external base region 4c as shown in FIG. 7(a), and an undercut portion 15 is formed beneath the dummy emitter 20 by etching (FIG. 7(a)), and thereafter, using the process of (d) through (g) in FIG. 6, an emitter electrode metal layer 10f used to cover the emitter mesa 8 in a form of umbrella as shown in FIG. 7(b) is formed, using dummy emitter 20.

Figure 8A:
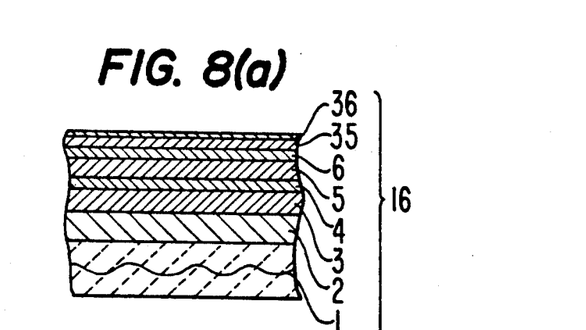
Figure 8B:
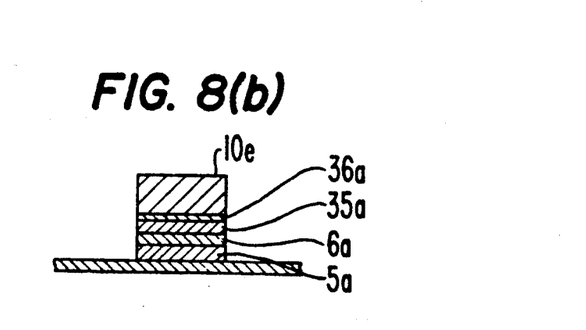

8. By forming a multilayer structural material 16 by epitaxial growth of a high doping density n-type $In_x$-$Ga_{l-x}As$ layer 35 in which x carrier continuously from 0 to 1 (n-$In_xGa_{l-x}As$ (x=0 to 1) and a high doping density n-type InAs layer 36 on the multilayer structure material 7, an emitter electrode metal layer 10e is formed as shown in FIG. 8(b) by applying the method of embodiment 6. Since the work function of InAs is greater than that of the electrode metal, a low resistance emitter contact may be obtained without any alloying heat treatment. In the embodiment, $In_xGa_{l-x}As$ continuously varying in composition and InAs are formed in layers, but $In_xGa_{l-x}As$ of a specific composition may be also formed in a layer.

Figure 6C:
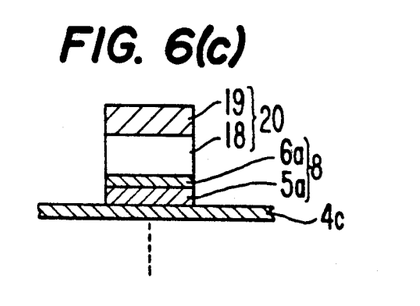
Figure 6D:
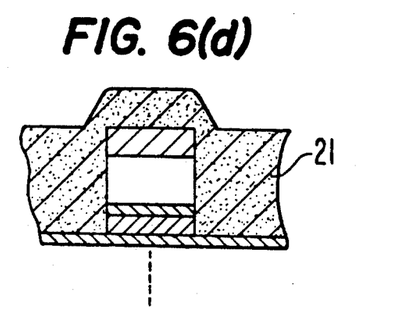
Figure 6E:
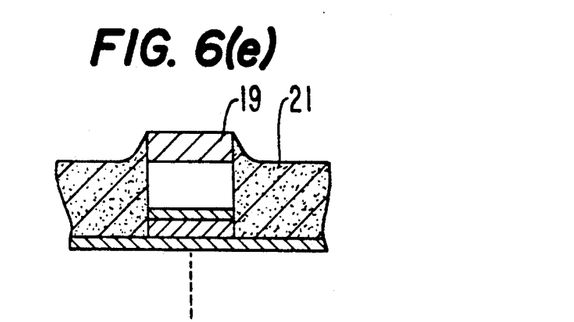
Figure 6F:
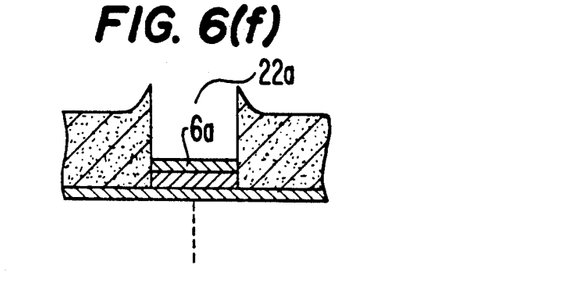
Figure 6G:
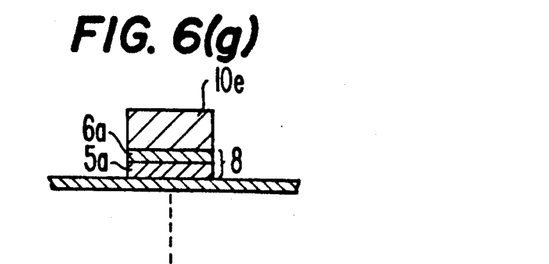

9. FIGS. 9(a)-(e) show a fabricating method of mushroom-shaped emitter electrode metal layer 10g. After forming an emitter mesa 8 by etching as shown in FIG. 6(c), using the dummy emitter 20 as a mask, the surface is covered with a thin film of $SiO_x$ of 3000 Å in thickness, and a side wall 17 composed of $SiO_x$ is formed on the sides of the emitter mesa 8 and dummy emitter 20 by anisotropic dry etching using $CHF_3$ (FIG. 9(a)). Then the surface is coated and flattened with a photosensitive resist 21 (FIG. 9(b)), and the upper part of the dummy emitter 20 is exposed by dry etching using an oxygen plasma (FIG. 9(c)), and after removing Al 19 by HCl, an opening 22b with n+-GaAs layer 6a exposed is formed by anisotropic dry etching using $CHF_3$ (FIG. 9(d)). In succession, AuGe, Ni, Ti and Au are evaporated in this order and lifted off, thereby forming an emitter electrode metal layer 10g.

Figure 10:
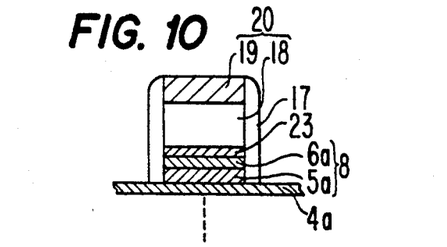
FIG. 10 shows a case of using $Al_xGa_{l-x}As$ ($x \geq 0.4$) as a protective film of emitter-contact layer in the process shown in FIGS. 9(a)-(b)

10. By forming an $Al_xGa_{l-x}As$ layer 23 where x is 0.4 or more on the multilayer structural material in FIG. 6(a), the process of embodiment 9 is applied thereafter. However, in the process of FIG. 9(d), after removing the $SiO_x$ layer 18 and also removing $Al_xGa_{l-x}As$ layer 23 by using acid, the emitter electrode metal layer 10g is formed. By this method, damage of n+-GaAs layer 6a by dry etching may be prevented, and a clean n+-GaAs layer 6a appears, so that an ohmic contact of high quality may be obtained. This method may be also applied in embodiments 6 to 8.

Figure 11:
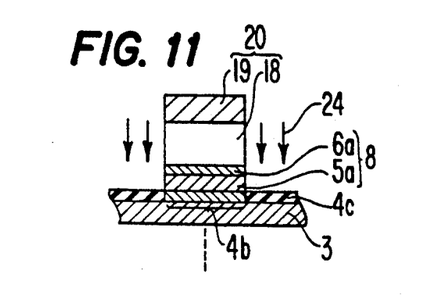
FIG. 11 shows a case of forming a high doping density external base region and FIG. 12 refers to a case of forming a thick external base region.

11. FIG. 11 shows a method of forming an external base region 4c of high dope p-type, by ion implantation of p-type dopant into the external base region 4c outside of the base region 4b just beneath the emitter electrode, using the dummy emitter 20 as a mask. After forming the structure of (c) in FIG. 6, Be+ is implanted using the dummy emitter 20 as mask (24), and it is heated to 750° C. for 10 seconds, so that a high doping density external base region 4c as shown in FIG. 11 is formed. Thereafter, applying the method of embodiment 6 shown in FIG. 6, the dummy emitter 20 is inverted to an emitter electrode metal layer 10e.

After ion implantation, it is necessary to anneal at a relatively high temperature, but adverse effects are not present because the n+-GaAs layer 6 is covered with the $SiO_x$ layer 18. Otherwise, Be+ may be implanted at the step of FIG. 6(b), or after etching until close to the external base region 4c, and then the external base may be exposed by etching. Or the implanted Be+ may penetrate even into the collection region 3. For this purpose, aside from Be+, Mg+ or Zn+ may be also used.

Figure 12:
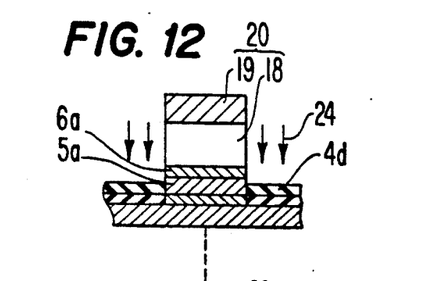

12. As shown in FIG. 12, after forming a dummy emitter 20 as in FIG. 6(b), Be+ is implanted, and part of GaAs layer 6 and $Al_xGa_{l-x}As$ layer 5 is etched off, and a thick external base region 4d is formed, so that the sheet resistance may be lowered. Thereafter, by applying the method shown in FIGS. 6(a)-(g), the dummy emitter 20 is inverted into an emitter electrode metal layer 10e.

Figure 13:
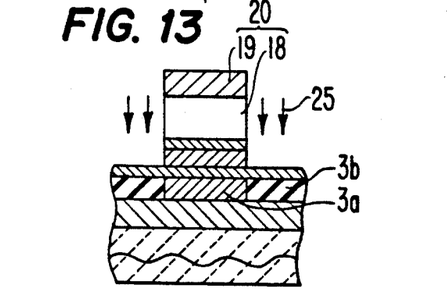
FIG. 13 denotes a method of forming a buried type collector region, in self-alignment with the emitter by ion implantation, using the dummy emitter as a mask.

13. FIG. 13 shows a method of forming a buried type collector 3a of the same size as the dummy emitter 20 by ion implantation, using the dummy emitter 20 as a mask. After the step shown in FIG. 6(c), a collector 3a substantially of the same size as the dummy emitter 20 and its peripheral insulating region 3b are formed by implanting O+ ions into the layer 3 using the dummy emitter 20 as a mask as shown in FIG. 13, and, by heat treatment at 750° C. for 10 seconds. Thereafter, by employing he method shown in FIGS. 6(a)-(g), the dummy emitter 20 is inverted into an emitter electrode metal layer 10e. Aside from O+, other ions such as B+ may be used. As in the embodiments 11 and 12, the heat treatment at high temperature is enabled owing to the existance of the $SiO_x$ dummy emitter.

Figure 14:
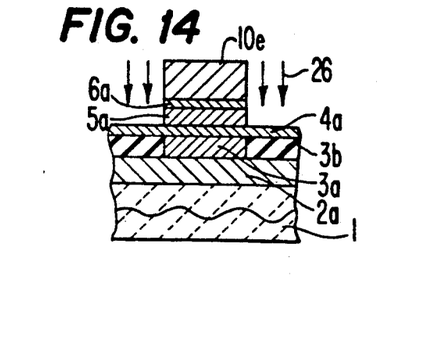
FIG. 14 shows a method of forming a buried type collector region in self-alignment with the emitter by ion implantation, using the emitter electrode metal layer as a mask.

14. After forming an emitter electrode metal layer 10e (FIG. 6(g)), the collector region 3a substantially of same size as the emitter electrode metal layer 10e and its peripheral insulating region 3b are formed by implanting H ions which are implanted into a layer 3 for forming a collector, as shown in FIG. 14, using the emitter electrode metal layer 10e as a mask. In the case of H+ ion implantation, since heat treatment is not needed in the formation of the insulating region, the contact part formed between the emitter electrode metal layer 10e and emitter is protected from damage. Hence, it is possible to form a buried type collector region 3a by using H+.

Figure 15A:
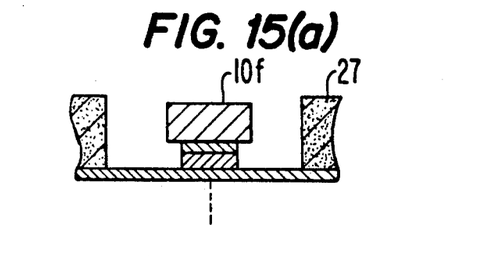
FIGS. 15(a)-(b) show a method of forming a base electrode metal layer using an umbrella-shaped emitter electrode metal layer as a mask.

15. After forming an umbrella-shaped emitter electrode metal layer 10f as shown in FIG. 7(b), base electrode metals 28 are evaporated and lifted off, using a photosensitive resist 27 and the electrode metal layer 10f as masks as shown in FIG. 15(a), and the base electrode metal layer 11c is formed outside of the base region 4b just beneath the electrode metal layer 10f. As a result, the base electrode 11c is formed by self-alignment at an extremely close distance from the emitter 5a, and the base resistance may be notably reduced.

Figure 16A:
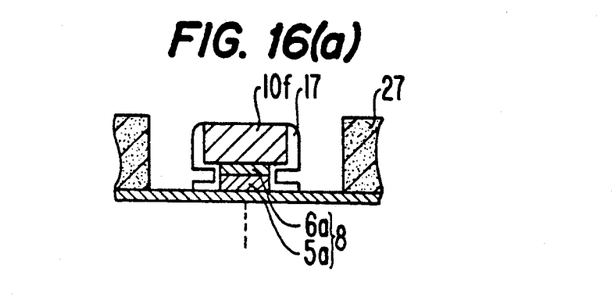
FIGS. 16(a)-(c) show a method of forming a base electrode metal layer using the umbrella-shaped emitter electrode metal layer and $SiO_x$ side wall formed at its side as a mask.
Figure 16B:
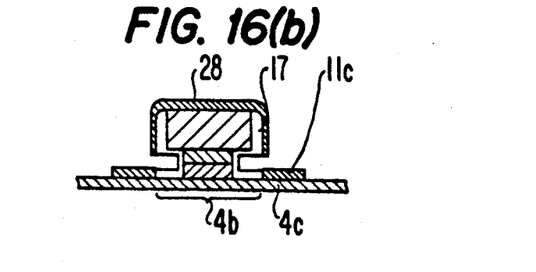
Figure 16C:
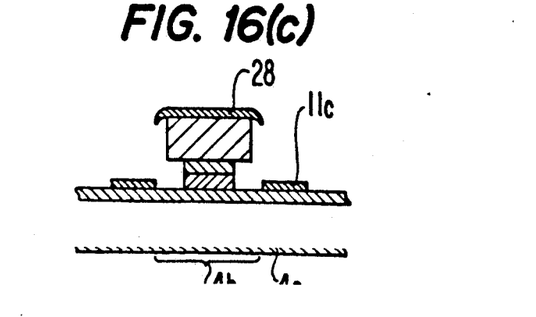

16. After forming an umbrella-shaped emitter electrode metal layer 10f as shown in FIG. 7(b), the surface is coated with a thin film of $SiO_x$ to a thickness of 3000 Å, and by anisotropic dry etching using $CHF_3$, an $SiO_x$ side wall 17 is formed on the sides around the emitter mesa 8 and electrode metal layer 10f as shown in FIG. 16(a). Furthermore, as shown in FIG. 16(b), base electrode metals 28 are evaporated and lifted off by using photosensitive resist 27 and the umbrella-shaped portion composed of electrode metal layer 10f and side wall 17 as masks. This forms the base electrode metal layer 11c in the external base region 4c outside of the base region 4b just beneath the electrode metal layer 10f and side wall 17, as shown in FIG. 16(b). Then the $SiO_x$ side wall 17 is removed by buffer HF.

Figure 17A:
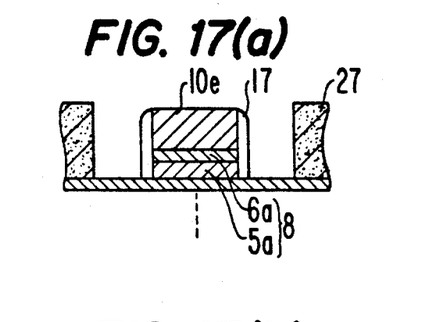
FIGS. 17(a)-(d) show a method of forming a base electrode metal layer using $SiO_x$ side wall formed on the side of the emitter and the emitter electrode metal layer covering the upper surface of emitter portion in the same size.
Figure 17B:
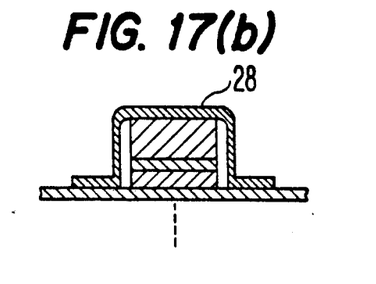
Figure 17C:
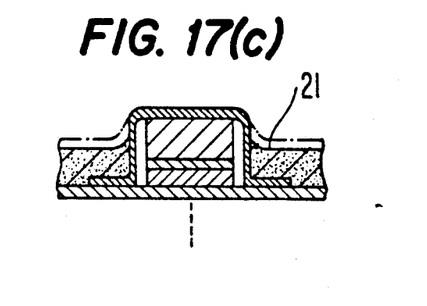
Figure 17D:
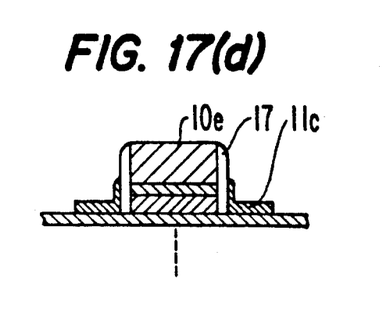

17. After forming an emitter electrode metal layer 10e (FIG. 6(g)), an $SiO_x$ side wall 17 is formed on the sides around the emitter mesa 8 and metal layer 10e, and a mask 27 of photosensitive resist is applied as shown in FIG. 17(a). In succession, the base electrode metal 28 is evaporated and lifted off, and a structure shown in FIG. 17(b) is formed. Then, the surface is covered with a photosensitive resist 21, and the upper portion of electrode metal layer 10e is exposed by dry etching using oxygen plasma as shown in FIG. 17(c). By etching away the metals 28 depositing on the side wall 17, the emitter electrode and base electrode are separated. As a result, as shown in FIG. 17(d), the base electrode metal layer 11c is formed at a distance of the width of side wall 17 with respect to emitter part 5a. Hence, the external base resistance may be reduced.

Figure 9A:
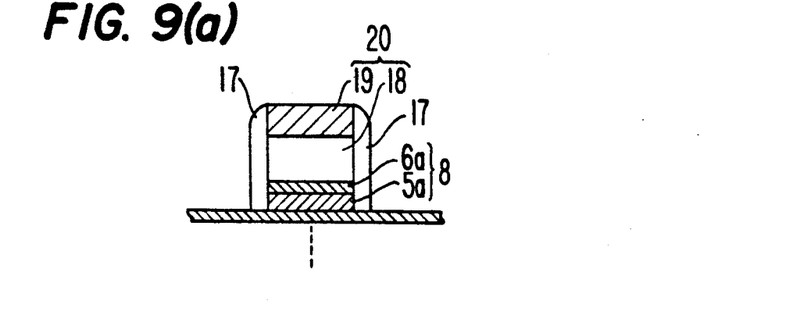
Figure 9B:
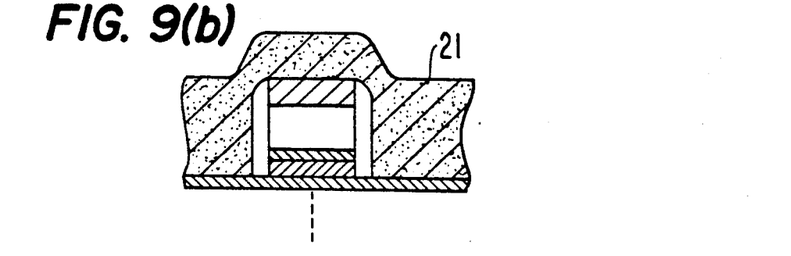
Figure 9C:
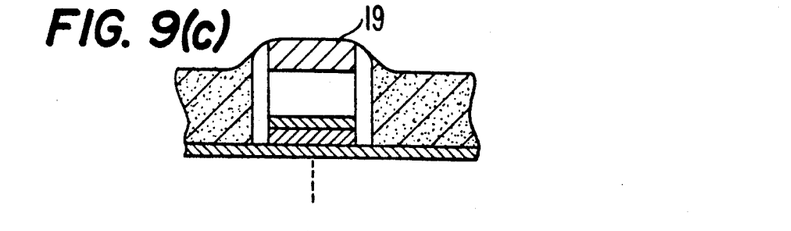
Figure 9D:
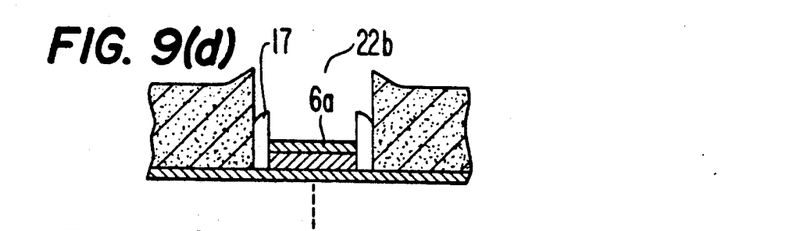
Figure 9E:
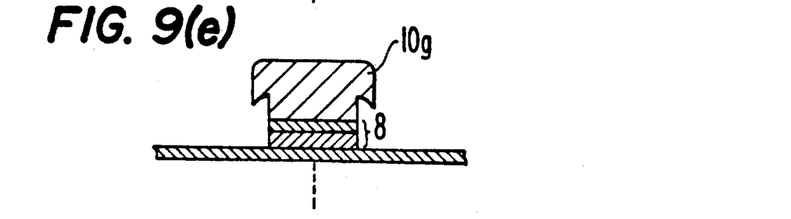
Figure 18A:
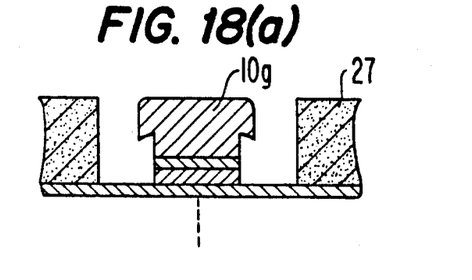
FIGS. 18(a)-(b) show a method of forming a base electrode metal layer using a mushroom-shaped emitter electrode metal layer as a mask.
Figure 18B:
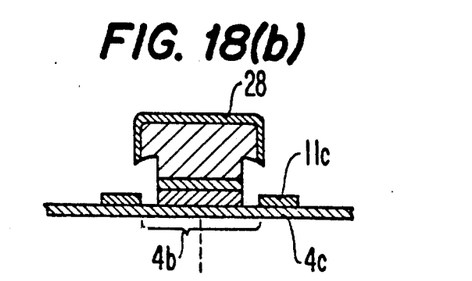

18. After forming a mushroom-shaped emitter electrode metal layer 10g as shown in FIG. 9(e), a mask 27 of photosensitive resist is formed as shown in FIG. 18(a), and base electrode metals 28 are evaporated and lifted off by using this mask 27 and the metal electrode layer 10g as mask. Consequently, a base electrode metal layer 11c is formed on the external base region 4c outside of the base region 4b just beneath the electrode metal layer 10g. As a result, the external base resistance can be reduced.

Figure 15B:
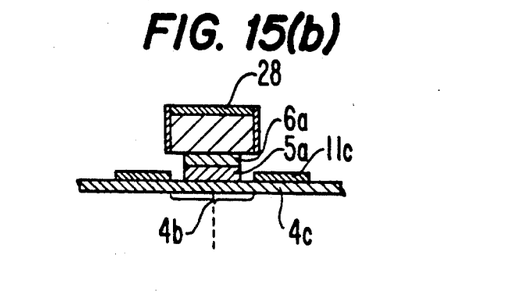
Figure 19A:
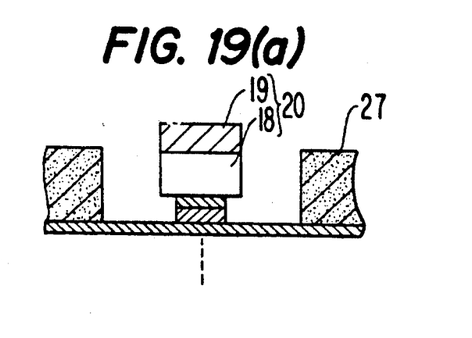
FIGS. 19(a)-(b) show a method of forming emitter electrode metal layer after forming a base electrode metal layer in self-alignment with the emitter using the umbrella-shaped dummy emitter as a mask.
Figure 19B:
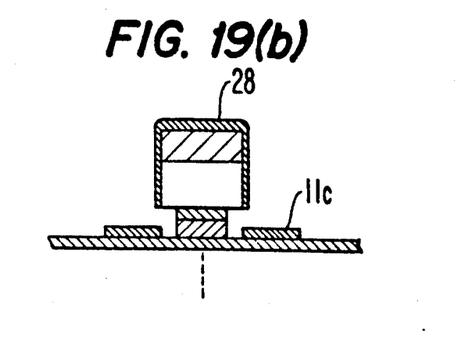

19. After the formation of the structure shown in FIG. 7(a), base electrode metals 28 are evaporated and lifted off by using a photosensitive resist 27 and dummy emitter 20 as masks as shown in FIG. 19(a). Consequently, a base electrode metal layer 11c is formed as shown in FIG. 11(b). Next, using the process of the inversion of the dummy emitter 20 into the emitter electrode metal layer as shown in embodiment 6, a structure corresponding to FIG. 15(b) is formed. As a result, the base electrode metal layer 11c is formed adjacent to the emitter 5a, and the base resistance may be lowered. In this method, incidentally, since the base electrode is formed first, it is important that the contact between the base electrode metal and external base is free from damage at the forming temperature of ohmic contact of emitter. In this embodiment, as the material used for base electrode metal, for example, Cr/Au or Cr/AuZn/Au may be used.

Figures 20A, 20B, 20C:
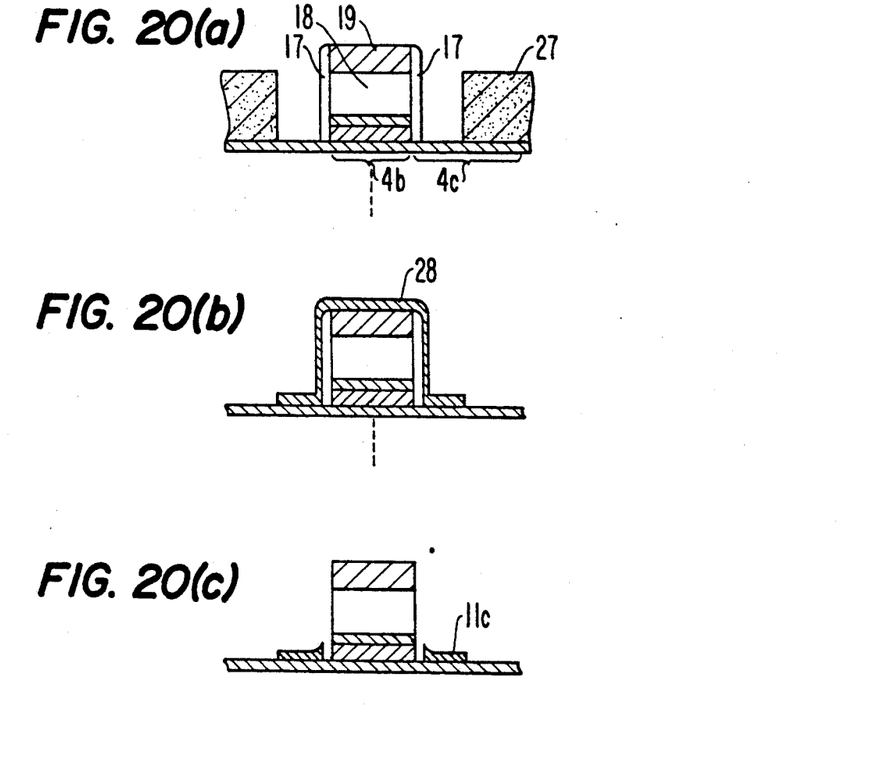
FIGS. 20(a)-(c) show a method of forming an emitter electrode metal layer after forming a base electrode metal layer by self-alignment, using a dummy emitter substantially of the same size as the emitter.
Figure 21A:
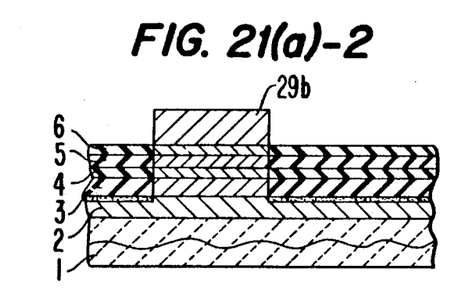
Figure 21A:
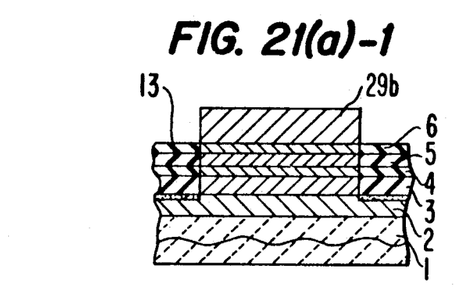
Figure 21B:
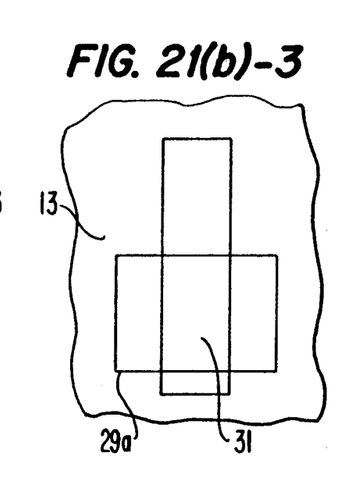
Figure 21B:
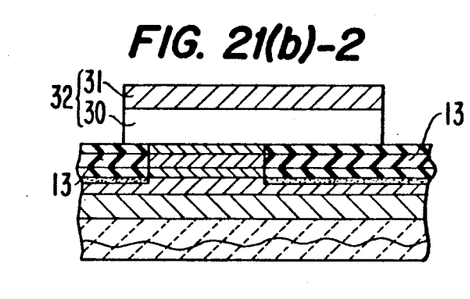
Figure 21B:
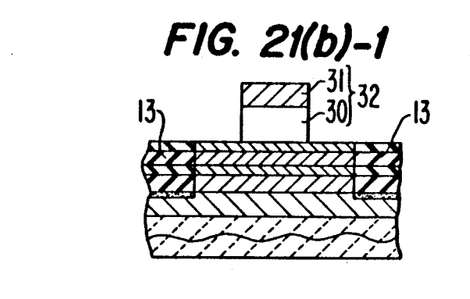
Figure 21C:
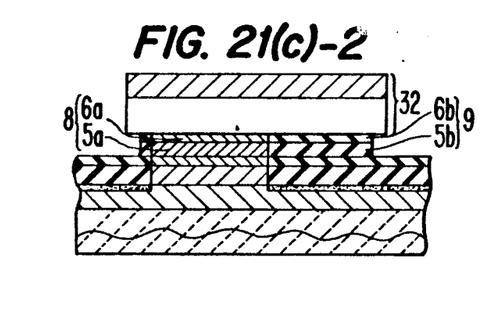
Figure 21C:
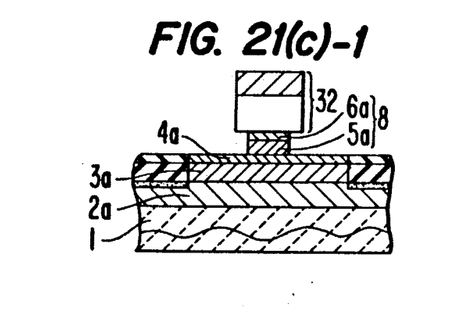

20. In the formation of structure in FIG. 9(a), a side wall 17 composed of $SiN_x$ is formed in a method similar to that shown in FIG. 20(a), and base electrode metals 28 are evaporated and lifted off through the mast 27 of photosensitive resist as shown in FIG. 20(b). Thereafter, applying the method of separation of the base electrode from emitter electrode as shown in embodiment 17, and selectively removing $SiN_x$ with respect to the dummy emitter 19, a structure as shown in FIG. 20(c) is formed. Then, conforming to the process of the inversion of the dummy emitter into the emitter electrode metal layer as shown in embodiment 6, the base electrode metal layer 11c is formed adjacent to the emitter part 5a. As in embodiment 19, it is necessary to select a metal, as a base electrode metal, whose ohmic contact forming temperature is not lower than the ohmic contact forming temperature of the emitter. In this embodiment, the external base region 4c can also be exposed by etching until close to the region 4c before forming the side wall 17, and then by etching up to the region 4c.

21. FIGS. 21(a)-1 to (b)-3 show a method of forming an emitting mesa 9 as shown in FIG. 1 and an electrode metal layer 10a serving both as an emitter electrode and as an emitter electrode delineation metal. On the multilayer structure material 7 shown in FIGS. 6(a)-(g), a mask 29b corresponding to the size 29a of the base is formed as shown in FIG. 21(a), and oxygen ions are implanted into the layer 3 for forming the collector. Consequently, an insulating region 13 is formed. Then, on the portion 29a corresponding to the base region, an extension type dummy emitter 32 composed of an $SiO_x$ layer 30 and an Al layer 31 extending from the emitter part to the insulation region 13 is formed by the method shown in embodiment 6 (FIG. 21(b)). Thereafter, according to the method shown in embodiment 7, an extension type emitter mesa 9 and an external base region 4c are formed (FIG. 21(c)), and an umbrella-shaped dummy emitter 32 is converted into an emitter electrode metal layer 10a. By employing this method, since the emitter electrode serves also as the emitter electrode delineation metal and it is formed by self-alignment corresponding to the emitter part, a bipolar transistor of a very small emitter size can also be fabricated. In this embodiment, although the method of forming an umbrella-shaped electrode metal layer is exhibited, the formation of the emitter electrode metal layer as disclosed in embodiments 6, 8, 9, 10 is also applicable.

Figures 22A, 22B:
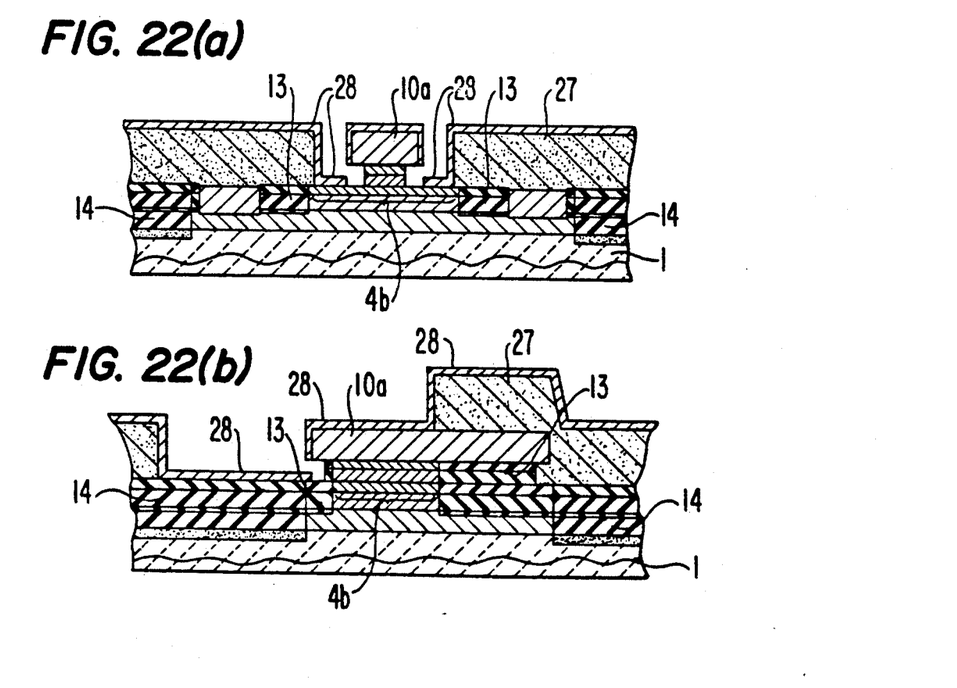
FIGS. 22(a)-(b) show a forming method of forming a base electrode metal layer positioned very close to the emitter portion and extending from the external base region to the base insulation region by using the emitter electrode metal layer of FIG. 21 as a mask.

22. FIGS. 22(a)-(b) show a method of forming, by self-alignment, a base electrode metal layer 11a serving as both the base electrode and the base electrode delineation metal and existing adjacent to the emitter portion, referring to a case of using an umbrella-shaped electrode metal layer. In the process shown in FIGS. 21(a)-1 to (b)-3, after forming an umbrella-shaped electrode metal layer 10a as shown in FIG. 1, a collector electrode 12a is formed as shown in FIG. 1, and H+ ions are implanted around the transistor. Consequently, an insulating region 14 ranging from the surface to substrate 1 is formed. Then, as shown in FIG. 22(a), base electrode metals 28 are evaporated and lifted off by using a photosensitive resist mask 27 and the umbrella-shaped emitter electrode metal layer 10a as a mask. Consequently, outside of the base region 4b just beneath the emitter electrode metal layer 10a, a base electrode metal layer 11a extending from the external base region to the peripheral insulating region 14 is formed. In this embodiment, although the method of embodiment 15 of using umbrella-shaped emitter electrode metal layer is employed, the method of formation of base electrode metal layer as disclosed in embodiments 16, 17, 18, 19, 20 is also applicable.

What is claimed is:

1. A method of producing a bipolar transistor comprising the steps of:

forming a multilayer structural material by forming at least a first layer, a second layer and a third layer of semiconductor material in this sequence on a substrate, the first and third layers possessing majority carriers different in carrier type from majority carriers of the second layer;

forming a dummy layer on the third layer;

wet etching the third layer using the dummy layer as a mask so as to form a projection made of the material of the third layer and to expose an external base region of the second layer;

changing the dummy layer without changing a size of the dummy layer to an electrode metal layer having the same size as the dummy layer on the third layer, the step of changing the dummy layer to the electrode metal layer comprising the substeps of: covering the surface of the multilayer structural material and the dummy layer with a photosensitive resin; dry etching the photosensitive resin to expose an upper surface of the dummy layer; removing the dummy layer to form an opening in which the third layer is exposed; evaporating an electrode metal on the exposed third layer and the photosensitive resin; lifting off the electrode metal evaporated on the photosensitive resin; and removing the photosensitive resin; and evaporating a base electrode metal on the exposed external base region using the electrode metal layer formed on the third layer as a mask to form a base electrode metal layer on the external base region.

2. A method according to claim 1, further comprising, before the step of changing the dummy layer to the electrode metal layer on the third layer, a step of introducing impurities into the first layer using the dummy layer as a mask to form the impurity introduced portion of the first layer into an insulating layer so that an active portion of the first layer becomes substantially the same size as the dummy layer.

3. A method according to claim 1, further comprising, after the step of changing the dummy layer to the electrode metal layer on the third layer, a step of introducing impurities into the first layer using the electrode metal layer on the third layer as a mask to form the impurity introduced portion of the first layer into an insulating layer so that an active portion of the first layer becomes substantially the same size as the electrode metal layer on the third layer.

4. A method according to claim 1, further comprising, before the step of forming the dummy layer, a step of introducing impurities into a peripheral part of a base region of the second layer to form the peripheral part into an insulating layer, wherein the dummy layer is formed to extend from a portion above the base region to a portion above the peripheral part.

5. A method of producing a bipolar transistor comprising the steps of:

forming a multilayer structural material by forming at least a first layer, a second layer and a third layer of semiconductor material in this sequence on a substrate, the first and third layers possessing majority carriers different in carrier type from majority carriers of the second layer;

forming a dummy layer on the third layer;

dry etching the third layer using the dummy layer as a mask so as to form a projection made of the material of the third layer and to expose an external base region of the second layer;

changing the dummy layer without changing a size of the dummy layer to an electrode metal layer having the same size as the dummy layer on the third layer, the step of changing the dummy layer to the electrode metal layer, comprising the substeps of: covering the surface of the multilayer structural material and the dummy layer with a photosensitive resin; dry etching the photosensitive resin to expose an upper surface of the dummy layer; removing the dummy layer to form an opening in which the third layer is exposed, evaporating an electrode metal on the exposed third layer and the photosensitive resin; lifting off the electrode metal evaporated on the photosensitive resin; and removing the photosensitive resin; and forming a side wall of an insulating material on a side surface of the projection made of the material of the third layer and a side surface of the electrode metal layer on the third layer;

evaporating a base electrode metal on the whole surface;

covering the whole surface including the evaporated base electrode metal with a photosensitive resin; and removing the base electrode metal evaporated on the side surface of the projection.

6. A method according to claim 5, further comprising, before the step of changing the dummy layer to the electrode metal layer on the third layer, a step of introducing impurities into the first layer using the dummy layer as a mask to form the impurity introduced portion of the first layer into an insulating layer so that an active portion of the first layer becomes substantially the same size as the dummy layer.

7. A method according to claim 5, further comprising, after the step of changing the dummy layer to the electrode metal layer on the third layer, a step of introducing impurities into the first layer using the electrode metal layer on the third layer as a mask to form the impurity introduced portion of the first layer into an insulating layer so that an active portion of the first layer becomes substantially the same size as the electrode metal layer on the third layer.

8. A method according to claim 5, further comprising, before the step of forming the dummy layer, a step of introducing impurities into a peripheral part of a base region of the second layer to form the peripheral part into an insulating layer, wherein the dummy layer is formed to extend from a portion above the base region to a portion above the peripheral part.

* * * * *